United States Patent
Kim et al.

(10) Patent No.: US 6,996,495 B2
(45) Date of Patent: Feb. 7, 2006

(54) CAPACITIVE MOTOR SENSOR

(75) Inventors: Moojin Kim, Kyungsangbuk-do (KR); Wonkyu Moon, Kyungsangbuk-do (KR); Wankyun Chung, Kyungsangbuk-do (KR)

(73) Assignee: POSTECH Foundation, Kyungsangbuk-do (KR)

( * ) Notice: Subject to any disclaimer, the term of this patent is extended or adjusted under 35 U.S.C. 154(b) by 19 days.

(21) Appl. No.: 10/737,783

(22) Filed: Dec. 18, 2003

(65) Prior Publication Data

US 2004/0124999 A1    Jul. 1, 2004

(30) Foreign Application Priority Data

Dec. 26, 2002 (KR) .................. 10-2002-0083898

(51) Int. Cl.
    *G01C 17/00* (2006.01)
    *G01C 19/00* (2006.01)
    *G01C 9/00* (2006.01)
    *G06F 15/00* (2006.01)

(52) U.S. Cl. .................................. 702/150
(58) Field of Classification Search .............. 702/42, 702/52, 150; 340/825, 870.3; 341/15; 318/662
See application file for complete search history.

(56) References Cited

U.S. PATENT DOCUMENTS

| 4,958,115 A | * | 9/1990 | Miller | ............. 318/662 |
| 5,537,109 A | * | 7/1996 | Dowd | .......... 340/870.37 |
| 2003/0030570 A1 | * | 2/2003 | Netzer | .......... 340/870.37 |

* cited by examiner

*Primary Examiner*—Aditya S. Bhat
(74) *Attorney, Agent, or Firm*—Bacon & Thomas, PLLC

(57) ABSTRACT

A capacitive motion sensor includes a primary plate including a primary pattern replicated periodically, a secondary plate including a plurality of pattern regions with an insulated region inserted there between, wherein each of the pattern regions has a secondary pattern replicated periodically, a signal source for sending a plate input signal to the primary plate, and a displacement measuring unit for receiving a plurality of plate output signals from the secondary plate to measure a displacement of a moving one of the plates with respect to the other one of the plates.

The primary plate is arranged in parallel with the secondary plate in such a manner that the primary pattern is confronted with the secondary pattern and the pattern regions of the secondary plate are arranged in a two-dimensional array.

23 Claims, 7 Drawing Sheets

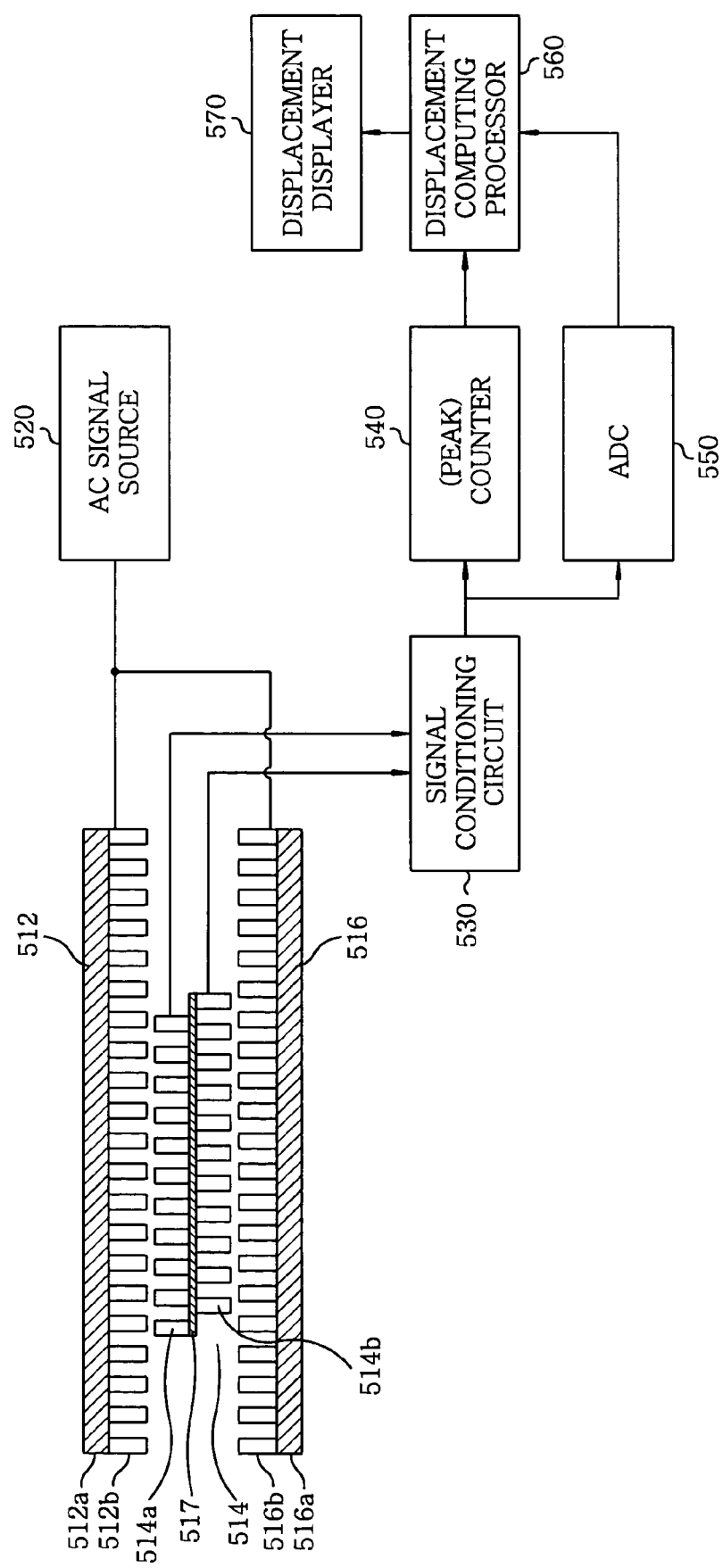

CAPACITIVE MOTOR SENSOR

FIELD OF THE INVENTION

The present invention relates to a capacitive sensor; and, more particularly, to an encoder-type capacitive motion sensor for measuring a fine linear motion.

BACKGROUND OF THE INVENTION

A capacitive motion sensor measures a relative motion between two elements, i.e., a moving element and a fixed element, by sensing a variation of electric capacitance between the two elements.

As for the capacitive motion sensor, two types of motion sensors, i.e., a spacing variation motion sensor and an area variation motion sensor, are well known. For the spacing variation motion sensor, a secondary plate moves in a vertical direction with respect to a primary plate and a capacitance between the two plates is mainly dependent on average plate spacing. With small plate spacing, this type of motion sensor is very sensitive to a spacing change. However, the sensitivity decreases rapidly as the spacing gets larger.

For the area variation motion sensor, a secondary plate slides transversely over a primary plate and the capacitance is mainly dependent on the area of a region on which the two plates are overlapped. This type of motion sensor is less sensitive but can measure a broader range of motion than the spacing variation motion sensor.

However, for both spacing and area variation motion sensors, a measurement range is restricted in that resolution bits are numerically restricted. To overcome this limitation of measurement range without loss of resolution, encoder-type capacitive motion sensors have been developed. In an encoder-type capacitive motion sensor, a simple plate pattern is replicated periodically in a linear array so that periodic signals represent a relative motion. Thus, a signal cycle count establishes a coarse position while a signal phase establishes a fine position.

Referring to FIG. 1, there is illustrated a schematic diagram of a conventional encoder-type motion sensor. A part of FIG. 1 shows a perspective view of a primary and a secondary plate. The encoder-type motion sensor of FIG. 1 includes a primary plate 112, a secondary plate 114, an AC signal source 120, a signal conditioning circuit 130, a (peak) counter 140, an AD converter (ADC) 150, a displacement computing processor 160 and a displacement displayer 170. The primary and secondary plates 112 and 114, both conductive and having a pattern replicated periodically in a linear array, are arranged in parallel, the patterns on both of the plates being confronted with each other. A recurrence distance of the pattern of the primary plate 112 and that of the pattern of the secondary plate 114 are substantially identical with each other. The secondary plate 114, moving in a leftward or rightward direction, can be driven by, e.g., an external actuator.

As the secondary plate 114 moves on, the AC signal source 120 sends a plate input signal to the primary plate 112. The signal conditioning circuit 130 receives a plate output signal from the secondary plate 114, measures the capacitance variation between the two plates and sends an electrical signal containing information on the measured capacitance variation to the counter 140 and the AC converter 150. The counter 140 counts a number of peak recurrences of the electrical signal to generate a cycle count that is sent to the displacement computing processor 160.

The AD converter 150 detects and digitizes a phase of the electrical signal to generate a fine motion value to be sent to the displacement computing processor 160. The displacement computing processor 160, receiving the cycle count and the fine motion value, computes a displacement of the secondary plate 114 with respect to the primary plate 112 and sends a displacement value representing the displacement of the secondary plate 114 with respect to the primary plate 112 to the displacement displayer 170. Then, the displacement displayer 170, e.g., an LED display or a monitor, displays information on the displacement value.

As shown above, the conventional encoder-type motion sensor of FIG. 1 can measure a fine motion within a large range by combining the cycle count and the fine motion value. However, the conventional encoder-type motion sensor of FIG. 1 has some drawbacks. First, the conventional sensor of FIG. 1, when used alone, can only measure a one-dimensional displacement. Thus, a sensor of this kind, when used alone, cannot measure a two-dimensional displacement. Second, the conventional sensor of FIG. 1 cannot detect a direction of the displacement. That is, the conventional sensor of FIG. 1 cannot detect whether the secondary plate moves in one direction or the other in a reciprocating motion. Finally, the patterns of the plates in FIG. 1 are difficult to be formed into a minute size.

SUMMARY OF THE INVENTION

It is, therefore, a primary object of the present invention to provide an encoder-type motion sensor that can measure a two-dimensional displacement.

It is another object of the present invention to provide an encoder type motion sensor that can detect not only a magnitude of a displacement but also a direction of the displacement in a reciprocating motion.

It is still another object of the present invention to provide an encoder-type motion sensor having plates of which pattern can be easily formulated into a minute size.

In accordance with one aspect of the invention, there is provided a capacitive motion sensor including:

a primary plate including a primary pattern replicated periodically;

a secondary plate including a plurality of pattern regions, wherein each of the pattern regions has a secondary pattern replicated periodically and is electrically isolated from an adjacent one of the pattern regions by an insulated region;

a signal source for sending a plate input signal to the primary plate; and a displacement measuring unit for receiving a plurality of plate output signals from the secondary plate to measure a displacement between the primary plate and the secondary plate.

In accordance with another aspect of the invention, there is provided a capacitive motion sensor including:

a primary plate including a primary hole replicated periodically in a two-dimensional array, the primary plate being conductive;

a secondary plate including a secondary hole replicated periodically in a two-dimensional array, the secondary plate being conductive, wherein a distribution of the secondary hole is identical with a distribution of the primary hole;

a signal source for sending a plate input signal to the primary plate; and a displacement measuring unit for receiving a plurality of plate output signals from the secondary plate to measure a displacement of a moving one of the plates with respect to the other one of the plates.

BRIEF DESCRIPTION OF THE DRAWINGS

The above and other objects and features of the present invention will become apparent from the following description of preferred embodiments, given in conjunction with the accompanying drawings, in which:

FIG. 5 provides a schematic diagram of a reciprocating motion sensor in accordance with a fourth embodiment of the present invention.

DETAILED DESCRIPTION OF THE PREFERRED EMBODIMENTS

Hereinafter, preferred embodiments of the present invention will be described with reference to the accompanying drawings.

Figure 2:
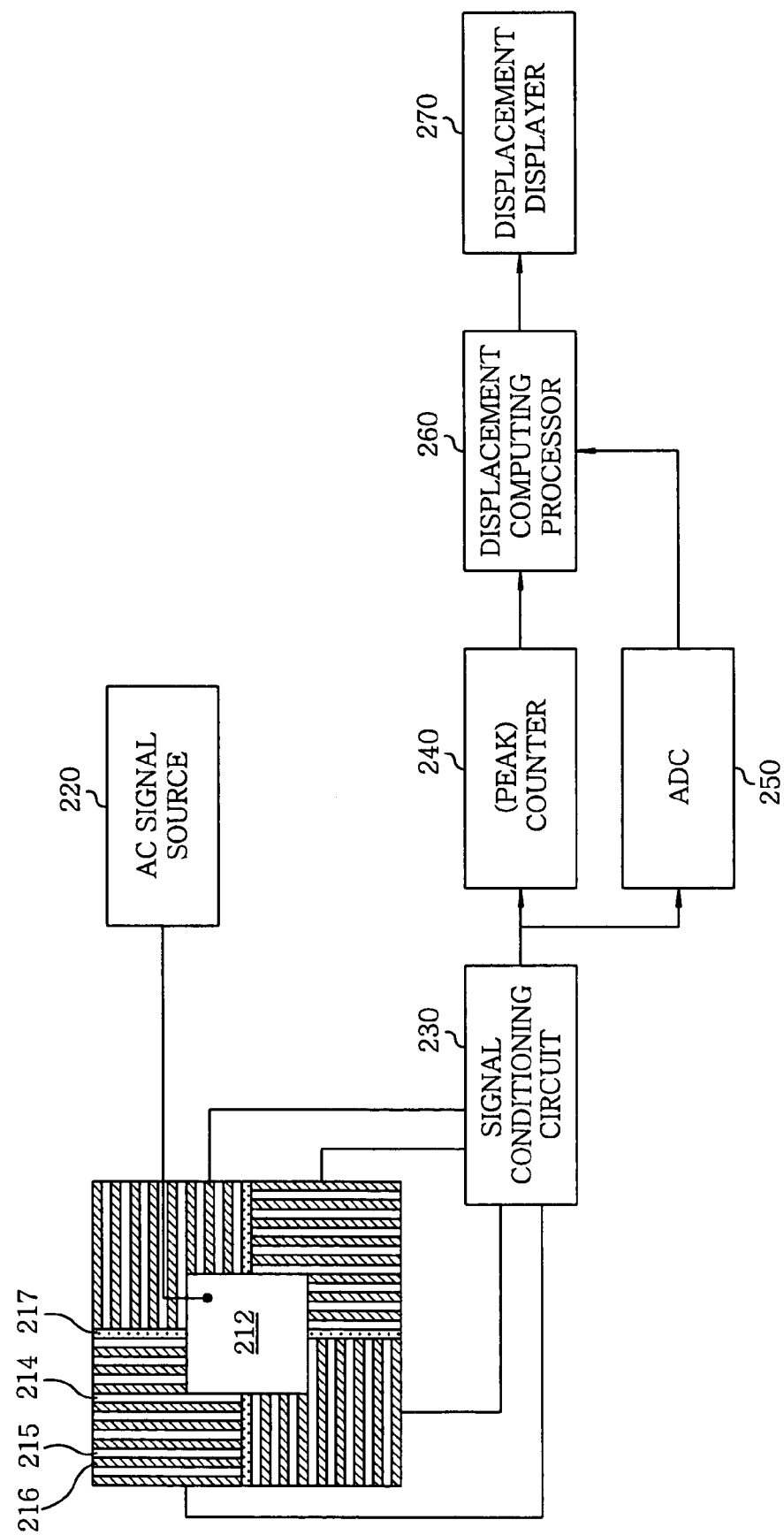
FIG. 2 provides a schematic diagram of a two-dimensional motion sensor in accordance with a first embodiment of the present invention.

Referring to FIG. 2, there is illustrated a schematic diagram of a two-dimensional motion sensor, i.e., an encoder-type motion sensor that can measure a two-dimensional displacement, in accordance with a first embodiment of the present invention. The two-dimensional motion sensor of FIG. 2 includes a primary plate 212, a secondary plate 214, an AC signal source 220, a signal conditioning circuit 230, a (peak) counter 240, an AD converter (ADC) 250, a displacement computing processor 260 and a displacement displayer 270. A blank region 217 represents a thin insulated region. A part of FIG. 2 shows a plain view of a secondary and a primary plate.

The primary and the secondary plate 212 and 214, having a primary pattern and a secondary pattern, respectively, are arranged in parallel in such a manner that the primary pattern is confronted with the secondary pattern. The secondary pattern includes, e.g., an elongated rectangular conductive projection, each of shaded regions 215 representing this projection. Alternatively, the secondary pattern includes, e.g., a long conductive band and a long insulated band, wherein, in this case, the blank region 215 and the shaded region 216 in the secondary plate 214 represent the conductive and the insulated band, respectively.

The secondary plate 214 has a plurality of, e.g., four, pattern regions electrically isolated from each other by the insulated region 217. The pattern regions, each of which has the secondary pattern replicated periodically in a linear array with a recurrence distance and a recurrence direction, are arranged in a two-dimensional array. In case the secondary pattern includes the conductive and the insulated band, all the conductive bands of each of the pattern regions are electrically connected to one another. The recurrence distance of the secondary pattern on each one of the pattern regions is substantially identical with that on an adjacent one of the pattern regions. And, the recurrence direction of the secondary pattern on each one of the pattern regions is different from that on an adjacent one of the pattern regions by, e.g., 90°.

The primary plate 212, capable of moving in a direction parallel to the secondary plate 214, can be driven by, e.g., an external actuator. The primary plate 212 partially or entirely overlaps at least two of the above-mentioned pattern regions as the primary plate 212 moves in a certain range. The primary pattern of the primary plate 212 is replicated periodically in a linear array with a recurrence distance and a recurrence direction, wherein the recurrence distance of the primary pattern is, e.g., substantially identical with the recurrence distance of the secondary pattern.

Figure 1:
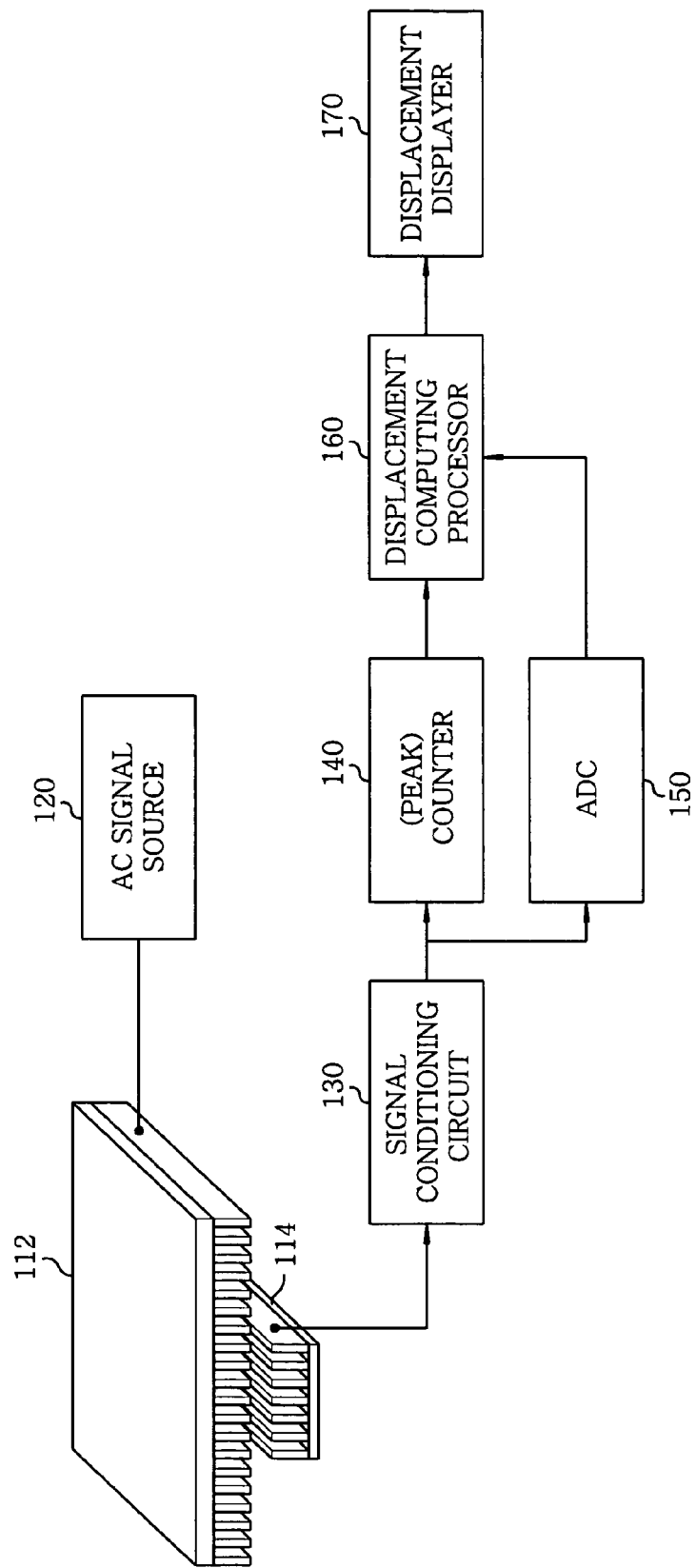
FIG. 1 illustrates a schematic diagram of a conventional capacitive motion sensor.

The sensor of FIG. 2 operates in a similar way as that of FIG. 1, but in this case the moving one of the plates makes a two-dimensional displacement and the measuring circuit receives a plurality of plate output signals. As the primary plate 212 moves on in a certain direction, the AC signal source 220 sends a plate input signal to the primary plate 212. The signal conditioning circuit 230, receiving a plate output signal from each conductive region, measures a capacitance variation between the primary plate 212 and each conductive region. Then, the signal conditioning circuit 230 sends a plurality of electrical signals to the counter 240 and the AD converter 250, each electrical signal containing information on the capacitance variation between the primary plate 212 and a corresponding conductive region. The counter 240 counts a number of peak recurrences of each electrical signal to generate a plurality of cycle counts to be sent to the displacement computing processor 260. The AD converter 250 detects and digitizes a phase of each electrical signal to generate a plurality of fine motion values that are sent to the displacement computing processor 260. The displacement computing processor 260, receiving the cycle counts and the fine motion values, computes an x-directional and a y-directional displacement of the primary plate 212 with respect to the secondary plate 214 and sends two displacement values, respectively representing the x-directional and the y-directional displacement of the primary plate 212 with respect to the secondary plate 214 to the displacement displayer 270. Then, the displacement displayer 270, e.g., an LED display or a monitor, displays the two-dimensional displacement.

Alternatively, instead of the primary plate 212 moving with respect to the secondary plate 214, the secondary plate 214 moves with respect to the primary plate 212. Alternatively, the primary plate 212 can have a plurality of, e.g., four, pattern areas electrically isolated from each other by a thin insulated area and each of the pattern areas has the primary pattern replicated periodically in a linear array.

Figure 3A:
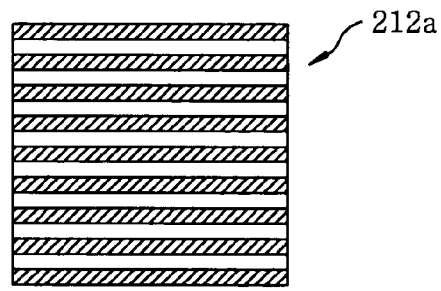
FIGS. 3A to 3C present plain views of three secondary plates in a two dimensional motion sensor in accordance with a first to a third modification of the first embodiment of the present invention, respectively.
Figure 3B:
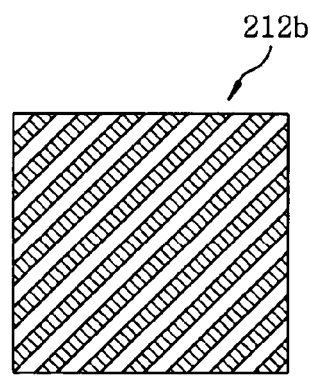
Figure 3C:
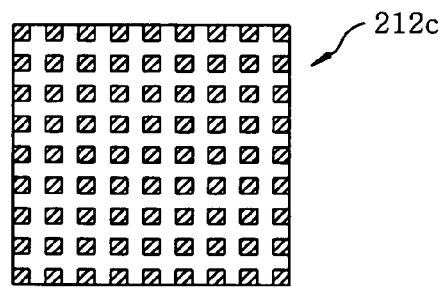

Referring to FIGS. 3A to 3C, there are illustrated plain views of three primary plates 212a to 212c in a two-dimensional motion sensor in accordance with a first to a third modification of the first embodiment of the present invention, respectively. The primary plate 212 can be replaced by one of the primary plates 212a to 212c.

The primary plate 212a includes the primary pattern replicated periodically in a linear array. Each primary pattern of the primary plate 212a and 212b has, e.g., an elongated rectangular conductive projection, each of shaded regions in FIGS. 3A and 3B representing this projection. Alternatively, each primary pattern of the primary plate 212a and 212b has, e.g., a conductive band and an insulated band, and a blank and a shaded region in FIGS. 3A and 3B represent the conductive and the insulated band, respectively. In the latter case, all the conductive bands are electrically connected to one another. The recurrence direction of the primary pattern of the primary plate 212b is different from the recurrence direction of the primary pattern of the primary plate 212a by, e.g., 45°. Alternatively, the primary plate 212a can be rotated by, e.g., 45° or 90°.

As shown in FIG. 3C, the sensor in accordance with the third modification includes the primary plate 212c in place of 212 in FIG. 2. The primary pattern of the primary plate 212c is, e.g., a repeat sequence of rectangular projections. Alternatively, the rectangular projection can be replaced by, e.g., a round projection or a hole.

Figure 4A:
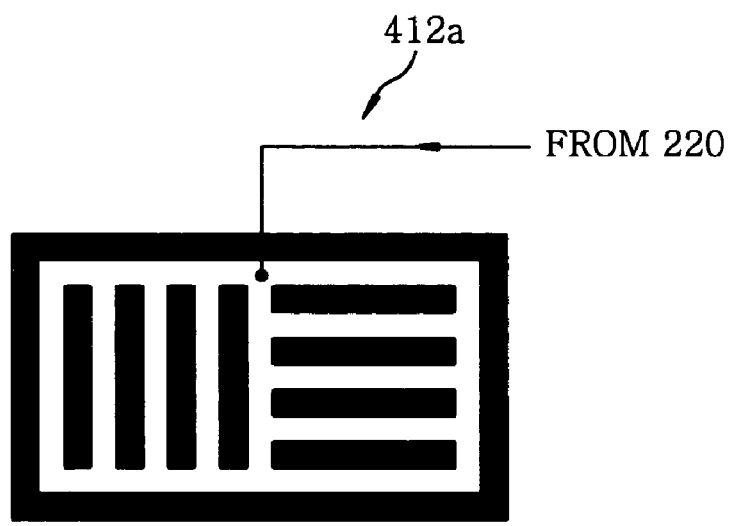
FIGS. 4A and 4B illustrate plain views of a primary plate and a secondary plate in a two-dimensional motion sensor in accordance with a second embodiment of the present invention.
Figure 4B:
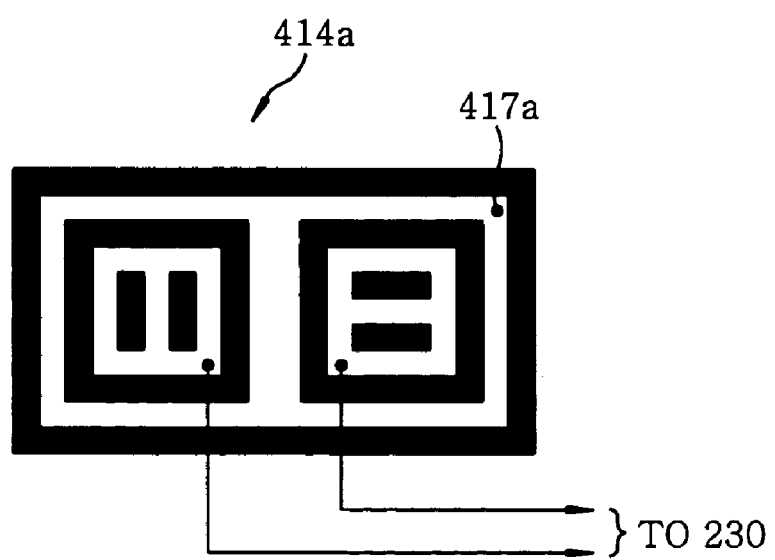

Referring to FIGS. 4A and 4B, there are illustrated plain views of a primary plate and a secondary plate in a two-dimensional motion sensor in accordance with a second embodiment of the present invention. The sensor in accordance with the second embodiment has a same configuration as that of FIG. 2, except that the primary plate 212 and the secondary plate 214 are replaced by the primary plate 412a and the secondary plate 414a, respectively. In other words, the sensor in accordance with the second embodiment includes the primary plate 412a, the secondary plate 414a, the AC signal source 220, the signal conditioning circuit 230, the counter 240, the AD converter 250, the displacement computing processor 260 and the displacement displayer 270. In FIGS. 4A and 4B, dark regions represent insulated regions and blank regions represent conductive regions.

The primary and the secondary plate 412a and 414a, having a primary pattern and a secondary pattern, respectively, are arranged in parallel in such a manner that the primary pattern is confronted with the secondary pattern. The secondary pattern includes, e.g., an insulated band.

The secondary plate 414a has a plurality of, e.g., two, pattern regions electrically isolated from each other by insulated regions. The pattern regions, each of which has the secondary pattern replicated periodically in a linear array with a recurrence distance and a recurrence direction, are adjacent to each other. The recurrence distance of the secondary pattern on each one of the pattern regions is substantially identical with that on an adjacent one of the pattern regions. And, the recurrence direction of the secondary pattern on each one of the pattern regions is different from that on an adjacent one of the pattern regions by, e.g., 90°. A conductive guard 417a encloses the secondary pattern, thereby making electric field lines between the primary plate 412a and the secondary plate 414a more uniform at the pattern regions.

The primary plate 412a, capable of moving in a direction parallel to the secondary plate 414a, can be driven by, e.g., an external actuator. The primary plate 412a partially or entirely overlaps at least two of the above-mentioned pattern regions as the primary plate 412a moves in a certain range. The primary pattern of the primary plate 412a is replicated periodically in a linear array with a recurrence distance and a recurrence direction, wherein the recurrence distance of the primary pattern is, e.g., substantially identical with the recurrence distance of the secondary pattern.

Figure 4C:
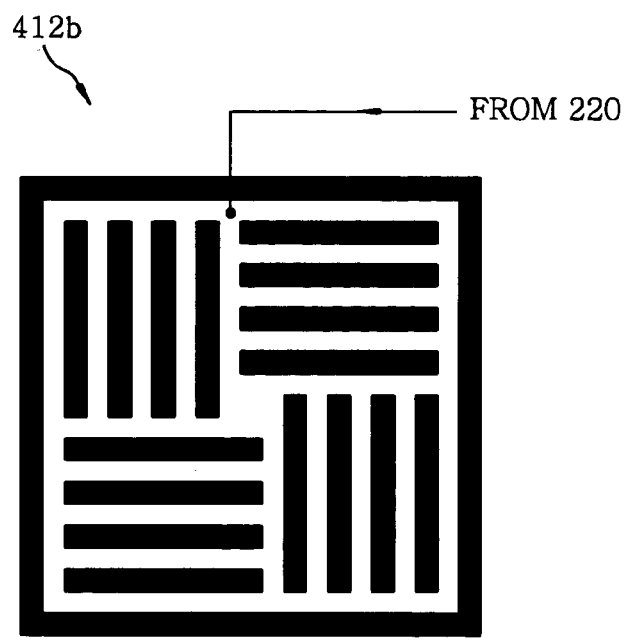
FIGS. 4C and 4D show plain views of a primary plate and a secondary plate in a two-dimensional motion sensor in accordance with a third embodiment of the present invention.
Figure 4D:
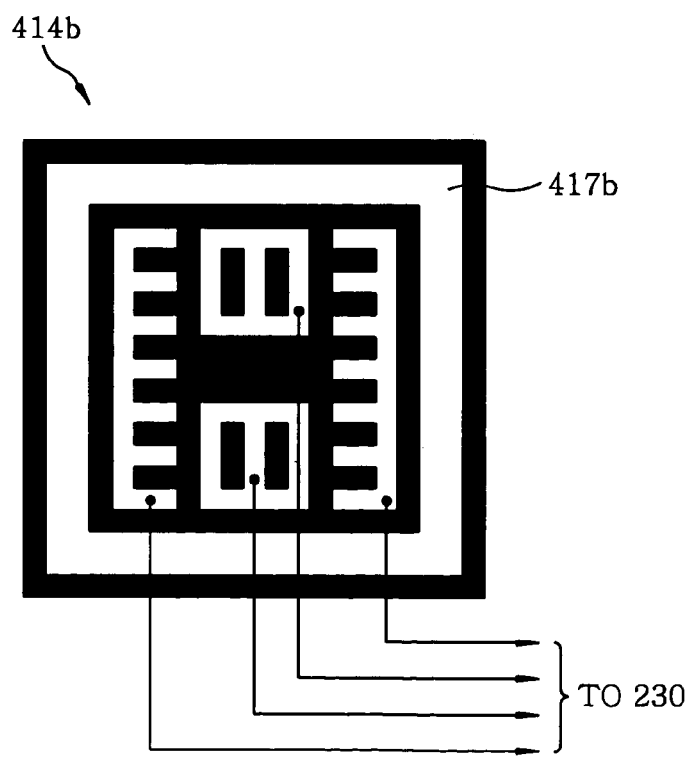

Referring to FIGS. 4C and 4D, there are illustrated plain views of a primary plate and a secondary plate in a two-dimensional motion sensor in accordance with a third embodiment of the present invention. The sensor in accordance with the third embodiment has a same configuration as that of FIG. 2, except that the primary plate 212 and the secondary plate 214 are replaced by the primary plate 412b and the secondary plate 414b, respectively. In other words, the sensor in accordance with the second embodiment includes the primary plate 412b, the secondary plate 414b, the AC signal source 220, the signal conditioning circuit 230, the counter 240, the AD converter 250, the displacement computing processor 260 and the displacement displayer 270. In FIGS. 4C and 4D, dark regions represent insulated regions and blank regions represent conductive regions.

The primary and the secondary plate 412b and 414b, having a primary pattern and a secondary pattern, respectively, are arranged in parallel in such a manner that the primary pattern is confronted with the secondary pattern. The secondary pattern includes, e.g., an insulated band.

The secondary plate 414b has a plurality of, e.g., four, pattern regions electrically isolated from each other by an insulated region. The pattern regions, each of which has the secondary pattern replicated periodically in a linear array with a recurrence distance and a recurrence direction, are arranged in such a manner that each one of the pattern regions is adjacent to at least two of the pattern regions. The recurrence distance of the secondary pattern on each one of the pattern regions is substantially identical with that on an adjacent one of the pattern regions. And, the recurrence direction of the secondary pattern on each one of the pattern regions is different from that on an adjacent one of the pattern regions by, e.g., 90°. A conductive guard 417b encloses the secondary pattern, thereby making electric field lines between the primary plate 412b and the secondary plate 414b more uniform at the pattern regions.

The primary plate 412b, capable of moving in a direction parallel to the secondary plate 414b, can be driven by, e.g., an external actuator. The primary plate 412b partially or entirely overlaps at least two of the above-mentioned pattern regions as the primary plate 412b moves in a certain range. The primary pattern of the primary plate 412b is replicated periodically in a linear array with a recurrence distance and a recurrence direction, wherein the recurrence distance of the primary pattern is, e.g., substantially identical with the recurrence distance of the secondary pattern.

Referring to FIG. 5, there is illustrated a schematic diagram of a reciprocating motion sensor, i.e., an encoder-type motion sensor that can detect not only a magnitude of a displacement but also a direction of the displacement in a reciprocating motion, in accordance with a fourth embodiment of the present invention. The reciprocating motion sensor of FIG. 5 includes a primary plate 512, a secondary plate 514, a tertiary plate 516, an AC signal source 520, a signal conditioning circuit 530, a counter 540, an AD converter 550, a displacement computing processor 560 and a displacement displayer 570. A part of FIG. 5 shows a side view of the primary, the secondary and the tertiary plate. In this part of FIG. 5, shaded regions 512a, 516a and 517 represent insulated regions and blank regions 512b, 514a, 514b and 516a represent conductive regions.

The secondary plate 514 includes a first pattern region 514a and a second pattern region 514b electrically isolated from each other by an insulated region 517 there between, one of the pattern regions being on an opposite side of the other one of the pattern regions. The first pattern region 514a and the second pattern region 514b have a first secondary pattern and a second secondary pattern, respectively.

The primary and the tertiary plate 512 and 516, having a primary pattern and a tertiary pattern, respectively, are arranged in parallel with the secondary plate 514 in such a manner that the primary pattern is confronted with the first secondary pattern and the tertiary pattern is confronted with the second secondary pattern. Each of the primary, the first secondary, the second secondary and the tertiary pattern is replicated periodically in a linear array with a recurrence distance and a recurrence direction, the recurrence distance and the recurrence direction of the first secondary pattern being substantially identical with those of the primary, second secondary and tertiary pattern. The secondary plate 514, capable of moving in a direction parallel to the recurrence direction of the primary pattern, can be driven by, e.g., an external actuator.

The first secondary pattern includes, e.g., a conductive rectangular projection. The second secondary pattern is substantially identical with the first secondary pattern. Alternatively, the spatial variation of the second secondary pattern can be scaled in a vertical direction with respect to that of the first secondary pattern. Alternatively, the first secondary pattern, substantially identical with the second secondary pattern, includes a conductive band and an insulated band. In the last case, all the conductive bands of each pattern region 514a and 514b are electrically connected to one another. A phase of the linear array of the second secondary pattern is different from a phase of the linear array of the first secondary pattern by a fraction of the recurrence distance, e.g., a half of the recurrence distance.

The primary pattern includes, e.g., a conductive rectangular projection. Preferably, the tertiary pattern is identical with the primary pattern. Alternatively, the spatial variation of the tertiary pattern can be scaled in a vertical direction with respect to the spatial variation of the primary pattern. Alternatively, the primary pattern, identical with the tertiary pattern, includes a conductive band and an insulated band. In the last case, all the conductive bands of each of the first and the tertiary plate 512 and 516 are electrically connected to one another. A phase of the linear array of the tertiary pattern is, e.g., substantially identical with a phase of the linear array of the primary pattern.

The sensor of FIG. 5 operates in a similar way as that of FIG. 1, but in this case the measuring circuit receives two plate output signals from the two pattern regions of the secondary plate in order to detect the direction of the displacement. As the secondary plate 514 moves on, the AC signal source 520 sends a plate input signal to the primary and the tertiary plate 512 and 516. The signal conditioning circuit 530, receiving a first plate output signal from the first conductive region and a second plate output signal from the second conductive region, measures a first capacitance variation between the first conductive region 514a and the primary plate 512 and a second capacitance variation between the second conductive region 514b and the tertiary plate 516. Then, the signal conditioning circuit 530 sends a first and second electrical signal, containing information on the first and the second capacitance variation, respectively, to the counter 540 and the AC converter 550. The counter 540, enumerating a first and a second cycle count, i.e., a cycle count of the first and the second electrical signal respectively, sends a first and a second cycle count value, respectively representing the first and the second cycle count, to the displacement computing processor 560. The AD converter 550 detects and digitizes a phase of the first electrical signal and a phase of the second electrical signal to generate a first and a second fine motion value, respectively representing the phase of the first and the second electrical signal, and sends the first and the second fine motion value to the displacement computing processor 560. The displacement computing processor 560, receiving the first and the second cycle count value as well as the first and the second fine motion value, computes a magnitude of a displacement of the secondary plate 514 with respect to the primary plate 512 and detects a direction of the displacement of the secondary plate 514 with respect to the primary plate 512 by comparing the first and the second fine motion value. Then, the displacement computing processor 560 sends displacement information representing the magnitude and the direction of the displacement of the secondary plate 514 with respect to the primary plate 512 to the displacement displayer 570. Then, the displacement displayer 570, e.g., an LED display or a monitor, displays information on the displacement.

Alternatively, the primary and the tertiary plate 512 and 516 can be mechanically connected to each other to move together, and, instead of the plate 514 moving with respect to the primary plate 512, the two mechanically connected plates 512 and 516 can move together with respect to the secondary plate 514. Alternatively, a phase of the linear array of the second secondary pattern is substantially identical with a phase of the linear array of the first secondary pattern and a phase of the array of the tertiary pattern is different from a phase of the array of the primary pattern by a fraction of the recurrence distance, e.g., a half of the recurrence distance.

Figure 6:
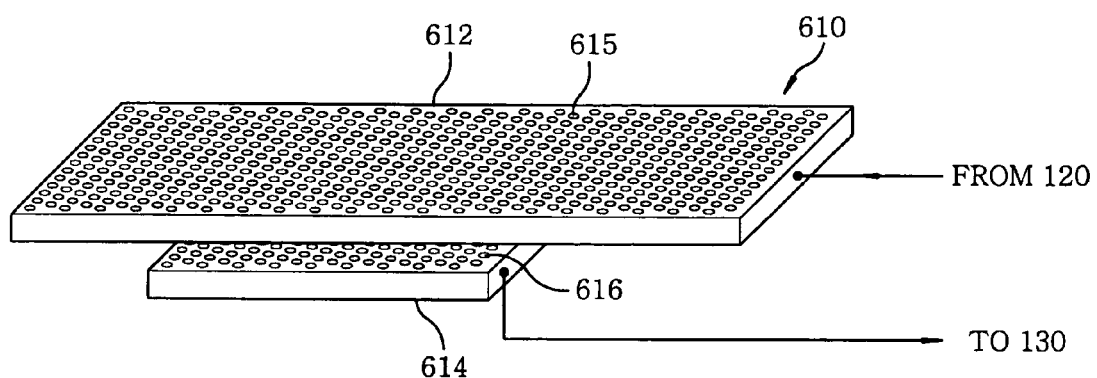
FIG. 6 presents a perspective view of a primary plate and a secondary plate in an encoder-type motion sensor in accordance with a fifth embodiment of the present invention.

Referring to FIG. 6, there is illustrated a perspective view of a primary plate and a secondary plate in an encoder-type motion sensor in accordance with the fifth embodiment of the present invention, of which patterns can be formulated minutely in a fabrication process. The encoder-type motion sensor in accordance with the fifth embodiment of the present invention has a same configuration as that of FIG. 1, except that the primary and the secondary plate 112 and 114 are replaced by a primary and a secondary plate 612 and 614, respectively. The encoder-type motion sensor in accordance with the fifth embodiment of the present invention includes a primary plate 612, a secondary plate 614, the AC signal source 120, the signal conditioning circuit 130, the counter 140, the AD converter 150, the displacement computing processor 160 and the displacement displayer 170.

The primary plate 612, being conductive, has a primary hole 615 replicated periodically in a two-dimensional array. The secondary plate 614, being conductive and having a secondary hole 616 replicated periodically in a two-dimensional array, is arranged in parallel with the primary plate 612. The primary hole 615 and the secondary hole 616 have a substantially identical distribution. In other words, each of the primary holes 615 can be partially or entirely overlapped by one of the secondary holes 616. The secondary plate 614, reciprocating in one direction or the other, can be driven by, e.g., an external actuator.

The sensor in accordance with the fifth embodiment of the present invention operates in a same way as that of FIG. 1. As the secondary plate 614 moves on, the AC signal source 120 sends a plate input signal to the primary plate 612. The signal conditioning circuit 130 receives a plate output signal from the secondary plate 614, measures the capacitance variation between the two plates and sends an electrical signal containing information on the measured capacitance variation to the counter 140 and the AC converter 150. The counter 140 counts a number of peak recurrences of the electrical signal to generate a cycle count to be sent to the displacement computing processor 160. The AD converter 150 detects and digitizes a phase of the electrical signal to generate a fine motion value to be sent to the displacement computing processor 160. The displacement computing processor 160, receiving the cycle count and the fine motion value, computes a displacement of the secondary plate 614 with respect to the primary plate 612 and sends displacement information representing the displacement of the secondary plate 614 with respect to the primary plate 612 to the displacement displayer 170. Then, the displacement displayer 170, e.g., an LED display or a monitor, displays information on the displacement.

Alternatively, instead of the primary plate 612 receiving the plate input signal and the secondary plate 614 generating the plate output signal, the secondary and the primary plate 614 and 612 can receive the plate input signal and generate the plate output signal, respectively.

As described above, the present invention provides an encoder-type motion sensor that can detect a two-dimensional displacement in a two-dimensional motion or a direction of a displacement in a reciprocating motion, or an encoder-type motion sensor of which pattern can be easily formulated into a minute size.

While the invention has been shown and described with respect to the preferred embodiments, it will be understood by those skilled in the art that various changes and modifications may be made without departing from the spirit and the scope of the invention as defined in the following claims.

What is claimed is:

1. A capacitive motion sensor comprising:
    a primary plate including a primary pattern replicated periodically;
    a secondary plate including a plurality of pattern regions, wherein each of the pattern regions has a secondary pattern replicated periodically and is electrically isolated from an adjacent one of the pattern regions by an insulated region, wherein the primary pattern is replicated periodically in a linear array with a recurrence distance and a recurrence direction and the secondary pattern is replicated periodically in another linear array with another recurrence distance and another recurrence direction, the recurrence direction of the secondary pattern on each one of the pattern regions being different from that on an adjacent one of the pattern regions;
    a signal source for sending a plate input signal to the primary plate; and
    a displacement measuring unit for receiving a plurality of plate output signals from the secondary plate to measure a displacement between the primary plate and the secondary plate.

2. The capacitive motion sensor of claim 1, wherein the primary plate is arranged in parallel with the secondary plate in such a manner that the primary pattern is confronted with the secondary pattern.

3. The capacitive motion sensor of claim 2, wherein the recurrence distance of the secondary pattern on each one of the pattern regions is identical with that on an adjacent one of the pattern regions and the recurrence distance of the primary pattern is identical with the recurrence distance of the secondary pattern.

4. The capacitive motion sensor of claim 3, wherein the recurrence direction of the secondary pattern on each one of the pattern regions is different from that on an adjacent one of the pattern regions by 90°.

5. The capacitive motion sensor of claim 3, wherein the primary pattern has a conductive projection.

6. The capacitive motion sensor of claim 5, wherein the secondary pattern has another conductive projection.

7. The capacitive motion sensor of claim 3, wherein the primary pattern has a conductive band and an insulated band.

8. The capacitive motion sensor of claim 7, wherein the secondary pattern has another conductive band and another insulated band.

9. The capacitive motion sensor of claim 3, wherein the primary pattern is a sequence of conductive projections.

10. The capacitive motion sensor of claim 3, wherein the primary pattern has an insulated band.

11. The capacitive motion sensor of claim 10, wherein the secondary pattern has another insulated band.

12. A capacitive motion sensor comprising:
    a primary plate including a primary pattern replicated periodically;
    a secondary plate including a plurality of pattern regions, wherein each of the pattern regions has a secondary pattern replicated periodically and is electrically isolated from an adjacent one of the pattern regions by an insulated region;
    a signal source for sending a plate input signal to the primary plate; and
    a displacement measuring unit for receiving a plurality of plate output signals from the secondary plate to measure a displacement between the primary plate and the secondary plate,
    wherein the primary plate is arranged in parallel with the secondary plate in such a manner that the primary pattern is confronted with the secondary pattern,
    wherein the primary pattern is replicated periodically in a linear array with a recurrence distance and a recurrence direction and the secondary pattern is replicated periodically in another linear array with another recurrence distance and another recurrence direction,
    wherein the displacement measuring unit includes:
    a signal conditioning circuit for receiving the plate output signals from the pattern regions of the secondary plate to measure a plurality of capacitance variations and outputting a plurality of electrical signals respectively representing the capacitance variations, wherein each of the capacitance variations is measured between the primary plate and a corresponding pattern region of the secondary plate;
    a counter for receiving the electrical signals from the signal conditioning circuit and counting numbers of peak recurrences of the electrical signals to output a plurality of cycle counts respectively representing the numbers of the peak recurrences;
    an AD converter for receiving the electrical signals from the signal conditioning circuit and detecting and digitizing phases of the electrical signals to output a plurality of fine motion values respectively representing the phases; and
    a displacement computing processor for receiving the cycle counts from the counter and the fine motion values from the AD converter and computing an x-directional displacement and a y-directional displacement of the moving one of the plates with respect to the other one of the plates.

13. The capacitive motion sensor of claim 12, wherein the recurrence distance of the secondary pattern on each one of the pattern regions is identical with that on an adjacent one of the pattern regions, the recurrence direction of the secondary pattern on each one of the pattern regions is different from that on an adjacent one of the pattern regions and the recurrence distance of the primary pattern is identical with the recurrence distance of the secondary pattern.

14. The capacitive motion sensor of claim 13, wherein the recurrence direction of the secondary pattern on each one of the pattern regions is different from that on an adjacent one of the pattern regions by 90°.

15. The A capacitive motion sensor comprising:
a primary plate including a primary pattern replicated periodically;
a secondary plate including a plurality of pattern regions, wherein each of the pattern regions has a secondary pattern replicated periodically and is electrically isolated from an adjacent one of the pattern regions by an insulated region;
a signal source for sending a plate input signal to the primary plate;
a displacement measuring unit for receiving a plurality of plate output signals from the secondary plate to measure a displacement between the primary plate and the secondary plate; and
a tertiary plate including a tertiary pattern, wherein the secondary plate includes a first pattern region having a first secondary pattern and a second pattern region having a second secondary pattern, the first pattern region is on an opposite side of the second pattern region.

16. The capacitive motion sensor of claim 15, wherein the primary plate is arranged in parallel with the secondary plate in such a manner that the primary pattern is confronted with the first secondary pattern and the tertiary plate is arranged in parallel with the secondary plate in such a manner that the tertiary pattern is confronted with the second secondary pattern.

17. The capacitive motion sensor of claim 16, wherein the primary pattern is replicated periodically in a linear array with a recurrence distance and a recurrence direction, the first secondary pattern is replicated periodically in another linear array with another recurrence distance and another recurrence direction, the second secondary pattern is replicated periodically in another linear array with another recurrence distance and another recurrence direction and the tertiary pattern is replicated periodically in another linear array with another recurrence distance and another recurrence direction.

18. The capacitive motion sensor of claim 17, wherein the respective recurrence distances of the primary pattern, the first secondary pattern, the second secondary pattern and the tertiary pattern are identical with each other, the respective recurrence directions of the primary pattern, first secondary pattern, the second secondary pattern and the tertiary pattern are identical with each other and respective phases of the linear array of the first secondary pattern and the second secondary pattern are different from each other by a fraction of the recurrence distance.

19. The capacitive motion sensor of claim 18, wherein the primary pattern has a conductive projection and the tertiary pattern has another conductive projection.

20. The capacitive motion sensor of claim 18, wherein the primary pattern has a conductive band and an insulated band and the tertiary pattern has another conductive band and another insulated band.

21. The capacitive motion sensor of claim 19, wherein the first secondary pattern has another conductive projection and the second secondary pattern has another conductive projection.

22. The capacitive motion sensor of claim 20, wherein the first secondary pattern has another conductive band and another insulated band and the second secondary pattern has another conductive band and another insulated band.

23. The capacitive motion sensor of claim 17, wherein the displacement measuring unit includes:
a signal conditioning circuit for receiving the first plate output signal from the first pattern region of the secondary plate and the second plate output signal from the second pattern region of the secondary plate to measure a first capacitance variation and a second capacitance variation and outputting a first and a second electrical signal respectively representing the first and the second capacitance variation, wherein the first capacitance variation is measured between the first pattern region of the secondary plate and the primary plate and the second capacitance variation is measured between the second pattern region of the secondary plate and the tertiary plate;
a counter for receiving the first and the second electrical signal from the signal conditioning circuit and counting two numbers of peak recurrences of the two electrical signals to output two cycle counts respectively representing the two numbers of the peak recurrences;
an AD converter for receiving the first and the second electrical signal from the signal conditioning circuit and detecting and digitizing the phases of the two electrical signals to output two fine motion values respectively representing the two phases; and
a displacement computing processor for receiving the two cycle counts from the counter and the two fine motion values from the AD converter and computing a magnitude and a direction of a displacement of reciprocating one or two of the plates with respect to the other one or two of the plates.

* * * * *